(12) United States Patent
Lindner

(10) Patent No.: US 6,536,454 B2
(45) Date of Patent: Mar. 25, 2003

(54) DEVICE FOR TREATING A DISC-SHAPED OBJECT

(75) Inventor: Johannes Lindner, Ferndorf (AT)

(73) Assignee: Sez AG (AT)

( * ) Notice: Subject to any disclaimer, the term of this patent is extended or adjusted under 35 U.S.C. 154(b) by 124 days.

(21) Appl. No.: 09/846,049

(22) Filed: May 1, 2001

(65) Prior Publication Data

US 2002/0002991 A1 Jan. 10, 2002

(30) Foreign Application Priority Data

Jul. 7, 2000 (DE) .......................... 100 33 172

(51) Int. Cl.[7] ................................. B08B 3/02
(52) U.S. Cl. ..................... 134/153; 134/157; 134/902; 134/182
(58) Field of Search ............... 134/25.4, 33, 148, 134/153, 182, 183, 100.1, 102.1, 902, 157; 156/345

(56) References Cited

U.S. PATENT DOCUMENTS

| | | | | |
|---|---|---|---|---|
| 4,021,278 A | * | 5/1977 | Hood et al. | |
| 4,544,446 A | * | 10/1985 | Cady | |
| 4,788,994 A | * | 12/1988 | Shinbara | |
| 4,838,979 A | * | 6/1989 | Nishida et al. | |
| 5,375,291 A | | 12/1994 | Tateyama et al. | ............. 15/302 |
| 5,591,262 A | * | 1/1997 | Sago et al. | |
| 5,651,160 A | * | 7/1997 | Yonemizu et al. | |
| 5,762,708 A | * | 6/1998 | Motoda et al. | |
| 5,815,762 A | * | 9/1998 | Sakai et al. | |
| 5,871,584 A | * | 2/1999 | Tateyama et al. | |
| 5,927,303 A | * | 7/1999 | Miya et al. | |
| 5,989,342 A | * | 11/1999 | Ikeda et al. | |
| 6,062,240 A | * | 5/2000 | Sada et al. | |
| 6,115,867 A | * | 9/2000 | Nakashima et al. | |
| 6,159,288 A | * | 12/2000 | Satou et al. | |
| 6,192,903 B1 | * | 2/2001 | Doi et al. | |
| 6,247,479 B1 | * | 6/2001 | Taniyama et al. | |
| 6,273,104 B1 | * | 8/2001 | Shinbara et al. | |
| 6,315,836 B1 | * | 11/2001 | Oka et al. | |
| 6,318,385 B1 | * | 11/2001 | Curtis et al. | |
| 6,357,457 B1 | * | 3/2002 | Taniyama et al. | |

FOREIGN PATENT DOCUMENTS

| | | | |
|---|---|---|---|
| JP | 62-263634 | * 11/1987 | |
| JP | 63-185029 | * 7/1988 | |
| JP | 4-2117 | * 1/1992 | |
| JP | 4-75342 | * 3/1992 | |
| JP | 4-213827 | * 8/1992 | |
| JP | 09314023 A | 12/1997 | ........... B05C/11/08 |

* cited by examiner

Primary Examiner—Frankie L. Stinson
(74) Attorney, Agent, or Firm—Mark Kusner; Michael A. Jaffe

(57) ABSTRACT

The invention relates to a device for treating at least one bottom of a disc-shaped object.

12 Claims, 2 Drawing Sheets

DEVICE FOR TREATING A DISC-SHAPED OBJECT

DESCRIPTION

Figure 1:
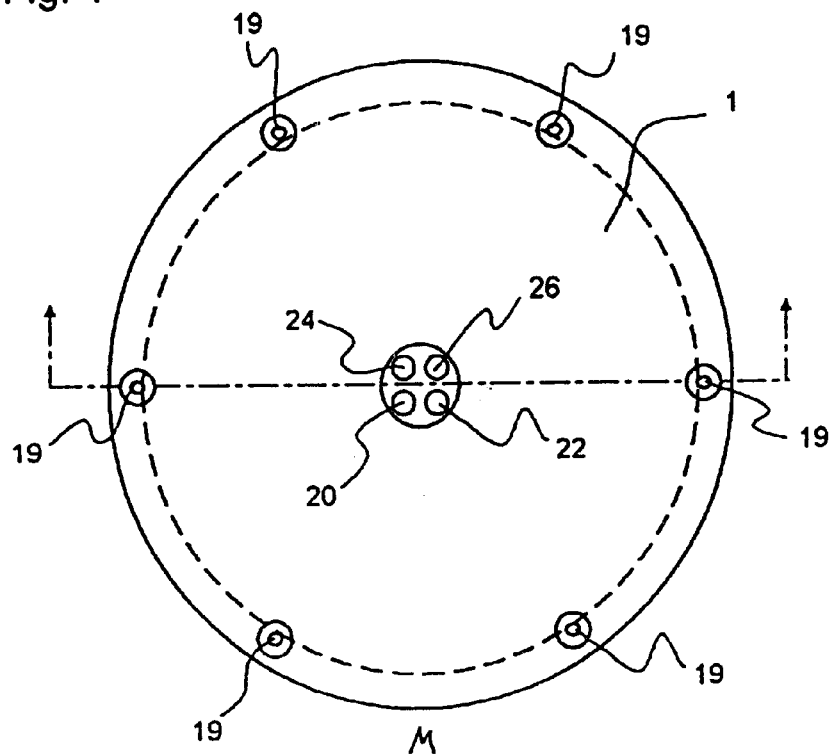

The invention relates to a device for treating at least the bottom of a disc-shaped object. Disc-shaped objects include semiconductor substrates such as silicon wafers, gallium arsenide wafers, but also glass discs, quartz discs, metal discs, flat-panel displays as well as so called hard disks and compact disks (CDs).

Treatment of surfaces of the disc-shaped object can for example be for the purpose of etching, cleaning, application of layers (e.g. electroplating) or for developing photosensitive resist.

During such treatment, liquids (either identical or different) can be applied to one or both surfaces of the disc-shaped object. If the same liquid is applied to both surfaces, said liquid can be collected and returned. The use of two different liquids may be necessary if e.g. one surface (the front) is etched and the other surface (the reverse) is to be protected at the same time against etching.

U.S. Pat. No. 5,375,291 A describes a device for simultaneous treatment, with liquid, of both surfaces of a disc-like object. The device comprises a rotatable carrier for holding the disc-shaped object and comprises means for applying a liquid to both sides of the object. The carrier is driven via a rotatable hollow shaft. Within the rotatable hollow shaft there is a stationary hollow shaft. The treatment liquid is supplied through the stationary hollow shaft. The rotating hollow shaft forms the shaft of a so-called hollow-shaft motor.

There is a disadvantage in that liquids and solids particles, for example caused by bearing abrasion, can enter through an open gap between the stationary and the rotating hollow shaft. This is associated with the danger of the disc-shaped object being contaminated.

According to JP 09-314023 A this problem is solved in that a cover is arranged above the gap. In addition, a labyrinth seal is arranged between the rotating part of the carrier and the cover. However, even then the results of the process are unsatisfactory. If previously several wafers were treated, the surface of the disc-shaped object which faces the carrier becomes contaminated. Investigations have shown that droplets of liquid also deposit on the cover.

It is thus the object of the invention to provide a device of the type mentioned, with which contaminations of the disc-shaped object can be reduced or prevented. This applies both to contaminations resulting from particles from the mechanical arrangement and from contaminations as a result of deposited droplets of liquid.

The invention is based on the following idea:

If a stationary device (cover) is arranged directly below the disc-shaped object to be treated (hereinafter referred to as a wafer), for example around the supply line for a treatment medium, turbulences occur in the space below the wafer, said turbulence causing the problems mentioned. The invention therefore uses a different approach: no further components are arranged between the rotatable carrier used for accommodating the wafer, and the wafer itself. The invention takes into account that by necessity there is a gap between the (stationary) supply line for the treatment medium and the rotating carrier, with droplets of liquid or dust particles being able to enter through said gap. According to the invention, elimination of said droplets of liquid or dust particles is effected by a stationary component of the device, hereinafter called the "cover", arranged below the carrier. Between the above-mentioned gap in the region of the upper face of the carrier in its extension, a further gap between the bottom of the carrier and the top of the static cover has been provided, by way of which gap said droplets of liquid and solids particles are able to be led away. Due to the rotational movement of the carrier in relation to the static cover, in this region of the gap, turbulence and centrifugal forces act on the foreign particles which in this way can safely be led away to the outside (radially in relation to the above-mentioned supply line for the treatment medium).

In its most general embodiment, the invention thus relates to a device for treating at least one bottom of a disc-shaped object with the following features:

A rotatable carrier with an upper face from which, perpendicular to the upper face of the carrier, at least two devices protrude for positioning the discshaped object;

At least one line for supplying a treatment medium against the bottom of the disc-shaped object, said line being arranged so as to be stationary and so as to penetrate the carrier at its centre;

A cover, arranged so as to be stationary, forming an annular gap and spaced apart from at least one section of a lower face of the carrier; with said cover being penetrated without leaving any clearance, by the line, of which there is at least one.

According to the first partial feature, the rotating carrier comprises at least two devices for positioning the wafer. Usually, at least three such devices are provided, for example at an angular spacing of 120 degrees in relation to each other. Such devices, also known as pins, can be arranged so as to be radially adjustable in order to guide/grip the wafer. The following description of the figures provides further information.

According to the second partial features, at least one treatment line leads through the device, preferably in the central longitudinal axis or parallel to said central longitudinal axis of the device, and thus perpendicular to the alignment of the wafer. Liquids or gasses for treating the wafer can be led through this line (these lines). Furthermore, one line can also be an optical waveguide which is for example used to detect light reflected from the bottom of the wafer. This waveguide can thus indicate a state in which treatment is completed. The waveguide can also indicate whether or not a wafer is in place at all.

The third partial features provides for a stationary cover, arranged below the carrier and spaced apart from said carrier. This stationary cover is free from play (seamlessly) connected to the stationary line(s). This results in a continuous channel (gap) extending from the upper face of the carrier, adjacent to the line(s), to the gap between the cover and the carrier. As explained below, this gap should be continued radially and open to the outside.

The purpose and function of the gap have already been described above.

According to one embodiment, the cover, adjacent to the line of which there is at least one, can comprise an inner part extending parallel to the upper face of the carrier, and an outer part, towards the margin, said outer part being inclined downwardly with respect to the upper face of the carrier. In this way, the radial removal of foreign particles or particles of liquid is facilitated.

So as to achieve a constant gap height, the lower face of the carrier can be constructed so as to correspond with the cover. According to a further embodiment the carrier protrudes from the cover on the outside and thus radially with respect to the line(s). This embodiment is also shown and explained in the following description of the figures.

The cover can be seated so as to be stationary, on a tubular body which accommodates the at least one line. The tubular body can be routed in the direction away from the upper face of the carrier through the device and onward to a stationary bottom.

According to a further embodiment, an annular disc follows the lower face of the carrier, towards the margin, said annular disc encompassing the line(s) at a distance; along its outer part said annular disc being connectable to the carrier and moreover may extend at a distance to the cover.

As an extension of the annular gap, between the carrier and the annular disc, at least one gap, essentially extending radially to the at least line can be arranged. Said gap creates the extension of the above-mentioned gap regions between the carrier and the line or between the carrier and the cover to the outside, so as to remove droplets of liquid or solids particles which as a result of rotary movement of the carrier or of the disc relative to the cover, under the influence of centrifugal forces, are removed to the outside.

Preferably a multitude of gap sections are provided between the outer section of the carrier and the outer section of the annular disc, with the individual sections again optionally being arranged around the circumference, at even angular spacing relative to each other.

On the inside, the annular disc which is arranged to rotate together with the carrier, can be guided on a rotary bearing which rests against the above-mentioned tubular body which carries the cover.

Furthermore, the annular disc may comprise a tubular extension, in particular on its inner part, said extension being aligned parallel to the line of which there is at least one, in the direction away from the lower face of the carrier and thus parallel to and spaced apart from the tubular body. The spacing between the tubular extension and the tubular body is important because a rotary component (the tubular extension) has to be positioned against a stationary component (tubular body). The tubular extension at the disc can be coupled to a rotary drive. For example the drive can be a motor whose rotor is connected to the tubular extension and whose stator rests against the tubular extension by way of at least one rotary bearing.

Apart from the treatment of the bottom of a wafer, as described, the device may comprise a further supply arrangement for a treatment medium above the wafer, so as to treat the top of the wafer too. In both cases the respective lines are stationary, without any interference from rotating components. Despite there are no problems when sealing the rotating components in relation to the stationary components.

Further features of the invention are provided in the features of the subclaims as well as in the other application documents.

Figure 2:
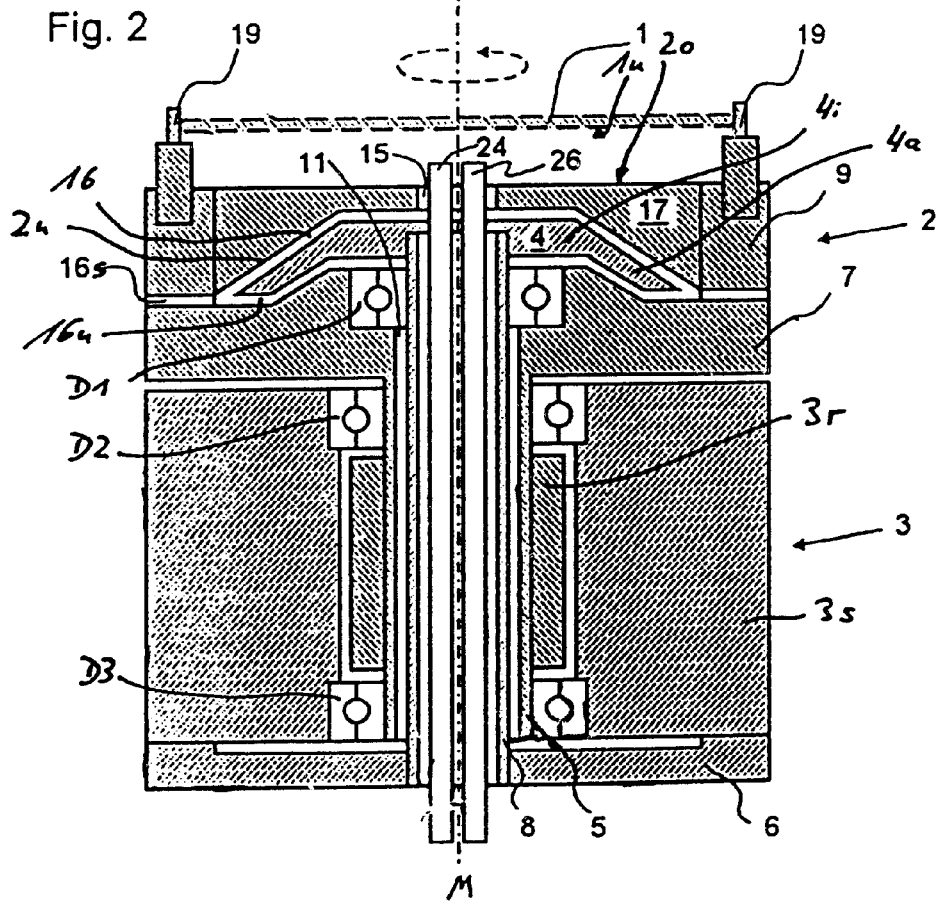
Figure 3:
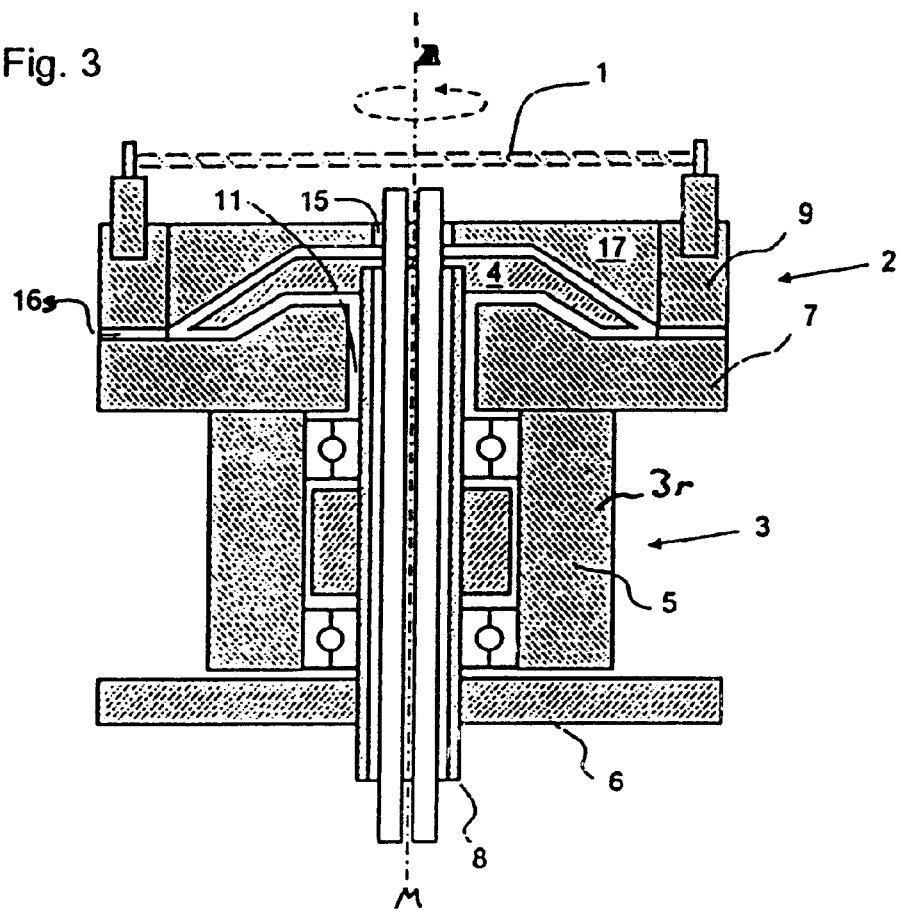
Figure 4:
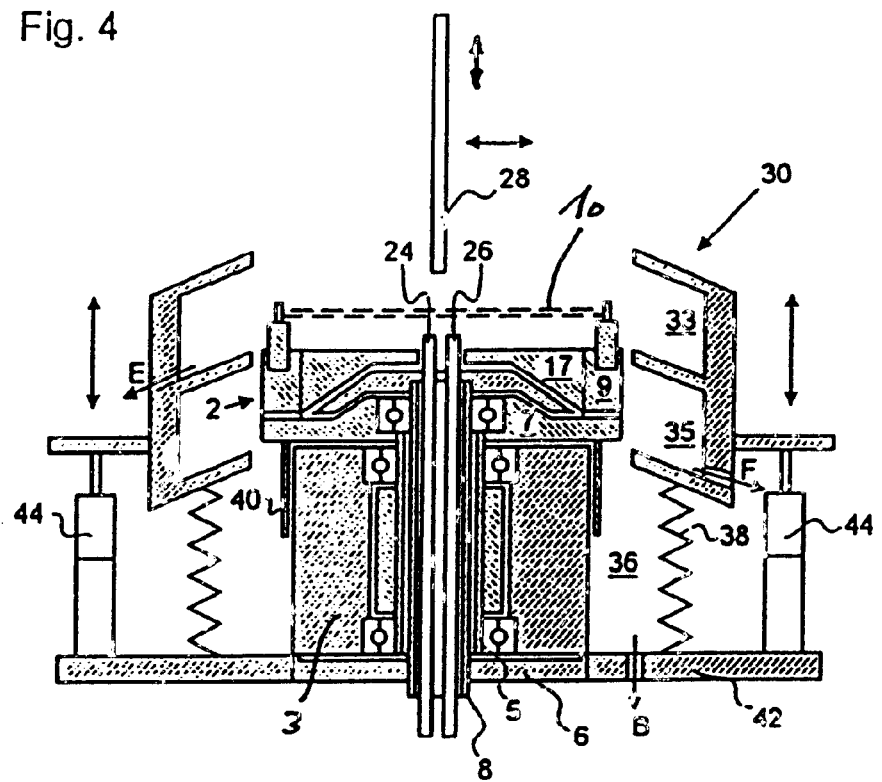

Hereinafter, the invention is described in more detail by means of various exemplary embodiments. The following is shown in diagrammatic representation:

FIG. 1: A top view of a device according to the invention;
FIG. 2: A longitudinal section of the device according to FIG. 1;
FIG. 3: A sectional view according to FIG. 2 showing a different drive compared to the drive of the embodiment according to FIG. 2;
FIG. 4: A longitudinal section analogous to that of FIG. 1 with an associated collection device for a treatment liquid.

In the Figures, same components or components having the same effect are shown using the same numerals.

A device shown in FIGS. 1, 2 comprises a rotatable carrier 2 comprising an outer ring 9 and an inner intermediate body 17 which in the centre (concentrically to the central longitudinal axis M of the device) comprises an aperture 15. From the ring 9, six gripping elements 19 (so-called pins) extend vertically upward from an upper face 2o of carrier 2. The guiding elements 19 are used to grip a wafer 1 along its periphery and hold it aligned parallel to the face 2o of the carrier 2. A cover 4 is arranged at a distance below the intermediate body 17, said cover 4 extending concentrically to the central longitudinal axis M and being seated on a tubular body 8 which in FIG. 2 extends downwardly to a base plate 6 of the device. The cover 4 comprises an inner section 4i, parallel to the upper face 2o of the carrier 2, and a downwardly inclined outer part 4a.

At a distance 16u below the cover 4, there follows an annular disc 7 which on its circumference is connected to the ring 9, which inwardly (at its upper end) is sitting on the tubular body 8 by means of a rotary bearing D1 and (at its lower end) comprises a tubular extension 5 which extends parallel to the tubular body 8, at a distance around the tubular body 8, downwardly in the direction of the base plate 6.

The aperture 15 in the intermediate body 17 continues in an annular gap 16 between the cover 4 and the carrier 2 (intermediate body 17) and being extended radially outwardly by way of various tubular channels 16s which are formed between the annular disc 7 and the ring 9.

During assembly of the device, first the disc 7 is arranged, then the cover 4 is put in place and finally the assembly comprising the ring 9 and the intermediate body 17 is supplied.

At a distance below the annular disc 7, a motor 3 is arranged which comprises an outer stator component 3s and an inner rotor component 3r which rests against the tubular extension 5, with the stator component 3s at the upper and lower extremity resting on the tubular extension 5 by means of two rotary bearings D2, D3. The motor (stator component 3s) rests on the base plate 6. In the centre, the base plate 6 comprises a recess so that the tubular extension 5 ends at a distance to the base plate 6.

Four lines 20, 22, 24, 26 extend in the stationary tubular body 8. Lines 22, 24 are for supplying a treatment liquid; line 26 is used for supplying a gas, and line 20 is a waveguide. All lines extend from a region below the base plate 6 to the region of the aperture 15 in the carrier 2; they protrude from the upper face 2o of the carrier 2, as shown in FIG. 2. The lines 20, 22, 24, 26 are guided without any clearance (seamlessly) through respective apertures in the cover 4.

After placing a wafer and switching on the motor 3, the following components of the device rotate: rotor 3r, annular disc 7, ring 9, intermediate body 17, gripping elements 19 and wafer 1.

On the other hand, the cover 4, the tubular body 8 and the base plate 6 as well as the stator component 3s of the motor remain stationary.

Liquid which is conveyed through the lines 22, 24 towards the bottom 1u of the wafer 1, is led to the outside due to the rotational movement of the wafer 1. In this way the bottom 1u of the wafer can for example be etched. Any particles of liquid falling down can be removed via the aperture 15 into gap 16 and from there to the outside by way of the gap extension 16s. Again, such removal is caused by centrifugal forces which are initiated by the rotating movement of the carrier 2 relative to the static cover 4.

By contrast to the embodiment according to FIG. 2 in which the motor 3 is a hollow-shaft motor with internal rotor, the drive in the embodiment according to FIG. 3 is a hollow-shaft motor which is a so-called external rotor design. In this arrangement, rotational movement is transmitted directly to the annular disc 7 and onward to the carrier 2, via the external rotor 3r. At the same time, the annular disc 7 is arranged at a distance to the stationary tube body 8, leaving a gap 11 between the two components, with said gap being covered by the cover 4.

The embodiment according to FIG. 4 is similar to that according to FIG. 2. In addition, at the circumference, a downward protruding cylindrical cover 40 joins the annular disc 7, said cover 40 shielding a gap between the annular disc 7 and the drive unit 3 (the motor) against an exterior process bowl 30.

The base plate 6 is extended on its circumference (section 42). From section 42 a lifting mechanism 44 which comprises two hydraulic lifting cylinders, extends upward. The process bowl 30 is connected to section 42 by way of a bellows 38 which is arranged concentrically to the central longitudinal axis M, with the diameter of said bellows 38 being similar to that of the process bowl 30. This results in an inner region 36.

The process bowl 30 comprises two annular chambers 33, 35, arranged one on top of the other and open to the inside. By way of the lifting mechanism 44, the process bowl 30 can be moved up or down. Treatment liquid which is being thrown off from the rotating wafer 1 can optionally be collected in chamber 33 or 35. Liquid can be removed from the chamber 33 via an aperture E. The chamber 35 empties via an aperture F at the bottom.

Above the wafer 1, a line 28 is arranged, with liquid being able to be applied to the surface 1o of the wafer by way of said line 28.

If the same liquid is applied to the upper and lower surface of wafer 1, said liquid can be processed (recycled) via a corresponding system (not shown) and resupplied to the wafer.

Liquid which was applied to the surface of the wafer 1 facing the carrier 2, can partly (to a small extent) find its way into the open region 15 of the intermediate body 17 as is shown in FIG. 2. Droplets of liquid then reach the non-rotating cover 4. During rotation of the carrier 2, a gas vortex is generated in the gap 16 between the cover 4 and the carrier 2 (intermediate body 17). These droplets on the cover 4 are conveyed radially outward by the gas vortex and are discharged from the device via gaps 16, 16s. Particles which for example result from bearing abrasion and which are located in the gap between the annular disc 7 and the cover 4, can be carried away in a similar way.

Droplets which arise on the face 2o of the carrier 2 facing the wafer 1, are conveyed radially outward by the rotation of carrier 2 and are thrown off in the same way as liquid reaching the wafer 1.

The region 36 within the process bowl 30 can be evacuated by way of an aperture B in section 42 of the base plate. In this way a constant downward gas stream is attained which prevents particles which form in the drive unit from reaching the wafer 1.

What is claimed is:

1. A device for treating at least one bottom (1u) of a disc-shaped object (1) with the following features:

1.1 A rotatable carrier (2) with an upper face (20) from which, perpendicular to the upper face (2o) of the carrier (2), at least two devices (19) protrude for positioning the disc-shaped object (1);

1.2 At least one line (20), (22), (24), (26) for supplying a treatment medium against the bottom (1u) of the disc-shaped object (1), said line (20), (22), (24), (26) being arranged so as to be stationary and so as to penetrate the carrier (2) at its center;

1.3 A cover (4), arranged so as to be stationary, forming an annular gap (16) and spaced apart from at least one section of a lower face (2u) of the carrier (2); with said cover (4) being penetrated without leaving any clearance, by the said at least one line (20), (22), (24), (26).

2. A device according to claim 1 in which the cover (4), adjacent to the at least one line (20), (22), (24), (26) comprises an inner part (4i) extending parallel to the upper face (2o) of the carrier (2), and an outer part (4a), being inclined downwardly with respect to the upper face (2o) of the carrier (2).

3. A device according to claim 1 in which the lower face (2u) of the carrier (2) is constructed so as to correspond with the cover (4).

4. A device according to claim 1 in which the carrier (2) protrudes the cover (4) radially with respect to the line (20), (22), (24), (26).

5. A device according to claim 1 in which the cover (4) is seated so as to be stationary, on a tubular body (8) which accommodates the at least one line (20), (22), (24), (26).

6. A device according to claim 1 in which an annular disc (7) adjoins the lower face (2u) of the carrier (2), said annular disc (7) encompassing the at least one line (20), (22), (24), (26) at a distance while being connected along its outer part to the carrier (2) and moreover extending at a distance (16u) to said cover (4).

7. A device according to claim 6 in which between the carrier (2) and the annular disc (7), as an extension of the annular gap (16), at least one gap (16s) essentially extending radially to the line (20), (22), (24), (26), is arranged.

8. A device according to claim 6 in which the annular disc (7) is guided along its inner part on a rotary bearing (D1) which rests against a tubular body (8) which carries the cover (4).

9. A device according to claim 6 in which the annular disc (7) comprises a tubular extension (5), said extension being aligned parallel to the at least one line (20), (22), (24), (26) in a direction away from the lower face (2u) of the carrier (2).

10. A device according to claim 9 in which the tubular extension (5) encompasses at a distance the at least one line (20), (22), (24), (26) and a tubular body (8) accommodating the at least one line (20), (22), (24), (26).

11. A device according to claim 9 in which the tubular extension (5) is coupled to a rotary drive (3).

12. A device according to claim 11 in which the rotary drive (3) is a motor whose rotor (3r) is connected to the tubular extension (5) and whose stator (3s) rests against the tubular extension (5) by way of at least one rotary bearing (D2), (D3).

* * * * *